United States Patent
Suguro et al.

(10) Patent No.: US 7,972,960 B1
(45) Date of Patent: Jul. 5, 2011

(54) METHOD FOR MANUFACTURING THIN FILM

(75) Inventors: Kyoichi Suguro, Kanagawa-ken (JP); Yoshitaka Tsunashima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/886,240

(22) Filed: Sep. 20, 2010

(30) Foreign Application Priority Data

Feb. 2, 2010 (JP) ................. 2010-021673

(51) Int. Cl.
*H01L 21/44* (2006.01)
(52) U.S. Cl. ................. 438/679; 257/E21.464
(58) Field of Classification Search ............ 438/679; 257/E21.464
See application file for complete search history.

(56) References Cited

U.S. PATENT DOCUMENTS

| | | | |
|---|---|---|---|
| 7,485,561 B2 * | 2/2009 | Basol | 438/610 |
| 7,622,382 B2 * | 11/2009 | Chowdhury et al. | 438/637 |
| 2004/0082195 A1 * | 4/2004 | Yudasaka et al. | 438/782 |
| 2004/0203235 A1 * | 10/2004 | Miyakawa | 438/689 |
| 2006/0234499 A1 * | 10/2006 | Kodera et al. | 438/641 |
| 2006/0286726 A1 * | 12/2006 | Sirringhaus et al. | 438/151 |
| 2009/0291230 A1 * | 11/2009 | Lin et al. | 427/553 |

FOREIGN PATENT DOCUMENTS

JP 2003-273111 9/2003

* cited by examiner

*Primary Examiner* — W. David Coleman
(74) *Attorney, Agent, or Firm* — Finnegan, Henderson, Farabow, Garrett & Dunner, L.L.P.

(57) ABSTRACT

A method for manufacturing a thin film includes: applying a liquid to a surface of a processing target member having at least one of a trench and a concave portion. The liquid includes a solvent and at least one of fine particles of a metal, fine particles of a semiconductor, fine particles containing a metal oxide, and fine particles containing a semiconductor oxide. A first heat treatment is included for volatilizing the solvent of the liquid applied to the surface of the processing target member. The fine particles are remained on the surface of the processing target member. A second heat treatment is also included for heating the fine particles by using microwave irradiation. At least one of the trench and the concave portion is filled with the thin film containing the fine particles or a component of the fine particles.

20 Claims, 6 Drawing Sheets

METHOD FOR MANUFACTURING THIN FILM

CROSS-REFERENCE TO RELATED APPLICATIONS

This application is based upon and claims the benefit of priority from the prior Japanese Patent Application No. 2010-021673, filed on Feb. 2, 2010; the entire contents of which are incorporated herein by reference.

FIELD

Embodiments described herein relate generally to a method for manufacturing a thin film.

BACKGROUND

Progress in computers and communication equipments has been accompanied by improving performance in the large-scale integrated circuits (LSI) that are included therein as the main components. The improvement in LSI performance has been achieved by increasing the level of integration, i.e. microminiaturizing elements and increasing stacking number of interconnection. On the other hand, the increased cost of manufacturing LSIs with higher levels of integration does not meet the market demands for cost reduction.

For example, in the LSIs including the 5 to 10 layers of copper (Cu) interconnection, a manufacturing cost in the interconnection process has come to be a large proportion of overall manufacturing costs. Therefore, a technology for forming thin films used in Cu interconnection and the like at a low cost is required. JP-A 2003-273111 (Kokai) describes a method for providing a thin film of a desired form by filling concave portions provided in a substrate with a solution in which ultrafine particles of film material are dispersed, and then performing heat treatment.

According to this method, thin films can be formed easily without using vacuum equipment as in sputter and vapor deposition methods. It is therefore possible to reduce the manufacturing costs. However, in the case that high temperatures are required in the heat treatment to convert the fine particles to the thin film, there may be limits on the processes that can be applied. Moreover, if the concave portions are not filled uniformly with the ultrafine particles, areas of high resistance may be formed and/or a break in the interconnection may occur. Hence, a film forming method in which the concave portions can be filled uniformly with the ultrafine particles and the heat treatment can be performed at a lower temperature is required.

DETAILED DESCRIPTION

Figure 1A:
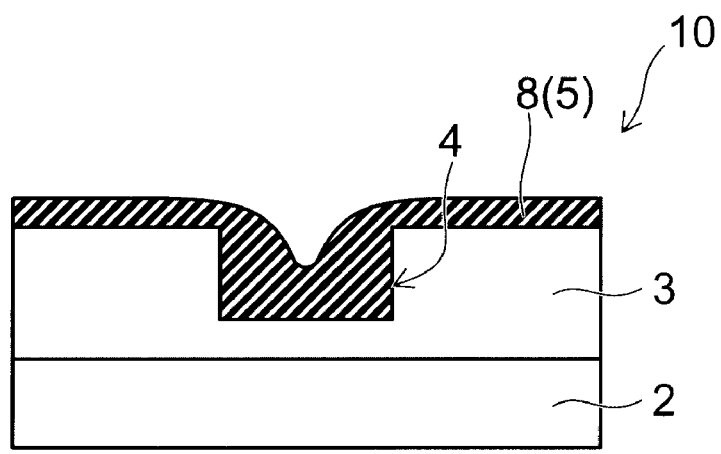
FIGS. 1A to 1C are cross-sectional views schematically illustrating a method of manufacturing a thin film according to a first embodiment.

According to one embodiment, a method for manufacturing a thin film includes applying a liquid to a surface of a processing target member having at least one of a trench and a concave portion. The liquid includes a solvent and at least one of fine particles of a metal, fine particles of a semiconductor, fine particles containing a metal oxide, and fine particles containing a semiconductor oxide. A first heat treatment is included for volatilizing the solvent of the liquid applied to the surface of the processing target member. The fine particles are remained on the surface of the processing target member. A second heat treatment is also included for heating the fine particles by using microwave irradiation. At least one of the trench and the concave portion is filled with the thin film containing the fine particles or a component of the fine particles. Embodiments of the invention will now be described with reference to the drawings. In the following embodiments, components that are identical in the drawings are labeled with the same numerals. Detailed descriptions of these components are omitted when appropriate, and differing components are described.

First Embodiment

Figure 1B:
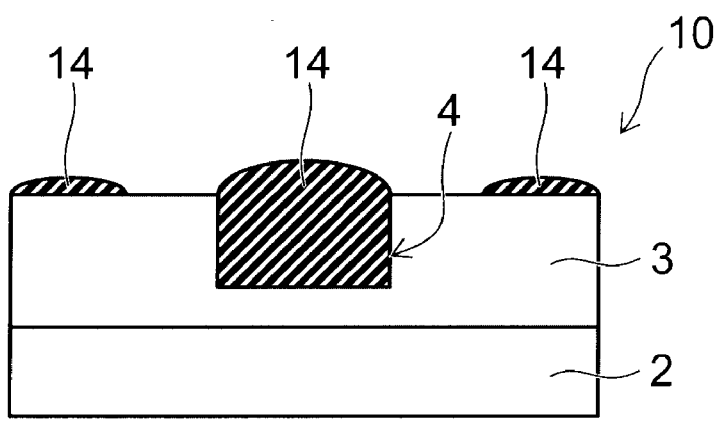
Figure 1C:
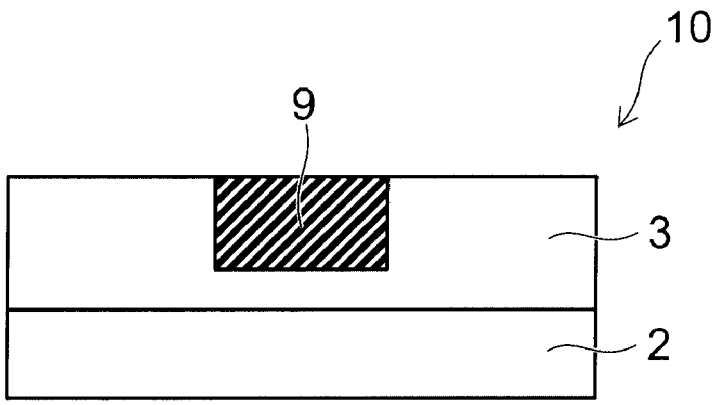

FIGS. 1A to 1C are cross-sectional views schematically illustrating a method of manufacturing a thin film according to a first embodiment. FIG. 1A is a cross-sectional view schematically illustrating a state in which a liquid 8 containing fine particles, which are a thin film material, dispersed therein is applied to a surface of a processing target member 10 that includes an insulation film 3 formed on a substrate 2. Additionally, FIG. 1B is cross-sectional view schematically illustrating a state in which a trench (or concave portion) 4 provided on a surface of the insulation film 3 above the substrate 2 is filled with a thin film material 14. FIG. 1C is a cross-sectional view illustrating a state in which a thin film 9 is formed filling the trench 4.

In the method for manufacturing a thin film according to this embodiment, first, the liquid 8 is applied to a surface of a processing target member 10 provided with the trench 4 where the thin film 9 is to be formed. The liquid 8 contains at least one of fine metal particles, fine semiconductor particles, fine particles including a metal oxide, and fine particles including a semiconductor oxide dispersed in a solvent.

For the substrate 2, a semiconductor substrate such as silicon can be used. A semiconductor substrate including an integrated circuit provided on a surface can also be used. As illustrated in FIG. 1A, the trench 4 where the thin film 9 is to be formed may be provided in the insulation film 3 formed on the substrate 2, or may be provided directly in the substrate 2.

The insulation film 3 provided on the surface of the substrate 2 is, for example, an interlayer insulation film and can be formed of silicon dioxide film ($SiO_2$). Additionally, when forming a Cu thin film for use as Cu interconnection, a barrier metal can be formed using such as a tantalum nitride film, titanium film, or titanium nitride film on a bottom surface and side surfaces of the trench 4.

Furthermore, the trench 4 may be a concave portion provided locally in the surface of the insulation film 3. Additionally, the trench can be a pattern of communicating trenches and concave portions. The trench 4 is described hereinafter, but it should be understood that cases in which a concave portion or a pattern of communicating trenches and concave portions are included.

For the fine particles dispersed in the liquid 8, ultrafine particles of Cu with a particle diameter of from 1 to 5 nm can, for example, be used. Besides Cu fine particles, metal fine particles including at least one element selected from a group of Ag, Au, and Al can also be used. Furthermore, when forming a semiconductor thin film, semiconductor fine particles including at least one element or compound selected from a group of Si, Ge, and SiGe can be used.

The particle diameter of the fine particles can be suitably selected based on a width of the trench 4. Ultrafine particles with smaller particle diameter are expensive. Hence, if the trench 4 has a width of 100 nm, it is not economical to use a liquid having ultrafine particles with an average diameter of 10 nm dispersed therein. In this case, as described hereinafter, the liquid 8 containing fine particles with an average particle diameter less than ⅓ of a minimum width of the trench can be used. It is thereby possible to uniformly fill the trench 4 with the fine particles dispersed in the liquid 8.

Additionally, for the liquid 8, a solvent that is water or an organic solvent with the fine particles dispersed therein can be used. Furthermore, the liquid 8 with the fine particles dispersed therein can, for instance, be applied to the surface of the substrate 2 using a spin coating method. Additionally, the liquid 8 can be applied to desired regions of the surface using an inkjet method.

Next, a first heat treatment is performed to volatilize (evaporate) the solvent of the liquid applied to the surface of the processing target member 10. For example, the processing target member 10 is placed in a baking oven maintained at a temperature in a range from 100° C. to 200° C. and treated for a predetermined period of time. The atmosphere within the baking oven can be an inert gas or dry air. In this way, the water or organic solvent is volatilized (evaporated) and removed from the liquid 8. As illustrated in FIG. 1A, the liquid 8 is left on the surface of the processing target member 10 as a particulate lump 5 of solidified fine particles.

Next, as a second heat treatment, the fine particles that formed the particulate lump 5 after the solvent was volatilized are heated by irradiation with microwaves. In this process, the processing target member 10 can be inserted into a chamber with an atmosphere containing a reductive gas and therein be irradiated with microwaves.

A frequency of the microwaves may be 3 GHz or higher. At these frequencies, the particles included in the particulate lump 5 efficiently absorb the microwaves. For example, when the particulate lump 5 contains silicon (Si) fine particles, the heating can be performed efficiently by using microwaves in a frequency band of 5.8 GHz or higher. According to a discovery of the inventors behind this application, the particles included in the particulate lump 5 can be melted or fluidized through irradiation with the microwaves with a power of up to 5 kW.

By using microwaves that are efficiently absorbed by the fine particles included in the particulate lump 5 in this way, the fine particles heated through absorption of the microwave energy are melted and fluidized. Alternatively, a liquid that includes a fine particle component is formed, wherein the fine particles have melted into a single body. Meanwhile, a temperature rise in the substrate 2, which has poor absorption efficiency, can be suppressed and, for example, can be held to 300° C. or less.

As described hereinafter, the fluidized fine particles or the component of the dissolved fine particles migrate towards the trench 4, and the trench 4 becomes filled with the thin film material 14, which includes the fine particles, or the component of the fine particles as illustrated in FIG. 1B.

In addition, after performing the second heat treatment, chemical mechanical polishing (CMP) is performed on the surface of the processing target member 10. In this way, any residue of the thin film material 14 left on the surface of the insulation film 3 and/or the thin film material 14 protruding above a top part of the trench 4 can be removed. As a result, as illustrated in FIG. 1C, it is possible to form the thin film 9 that is embedded in the trench 4 provided on the surface of the processing target member 10.

In the above-described second heat treatment, when, for example, the treatment is performed in an inert gas atmosphere that includes a reductive gas, the metal oxides or semiconductor oxides included in the fine particles can be reduced to form a metal thin film or a semiconductor thin film. When fine particles including Cu are used and the heating is performed through irradiation with microwaves in nitrogen or Ar gas atmosphere containing 5% or less of hydrogen gas, the Cu oxides are reduced, making it possible to form a Cu thin film 9 embedded in the trench 4.

Figure 2:
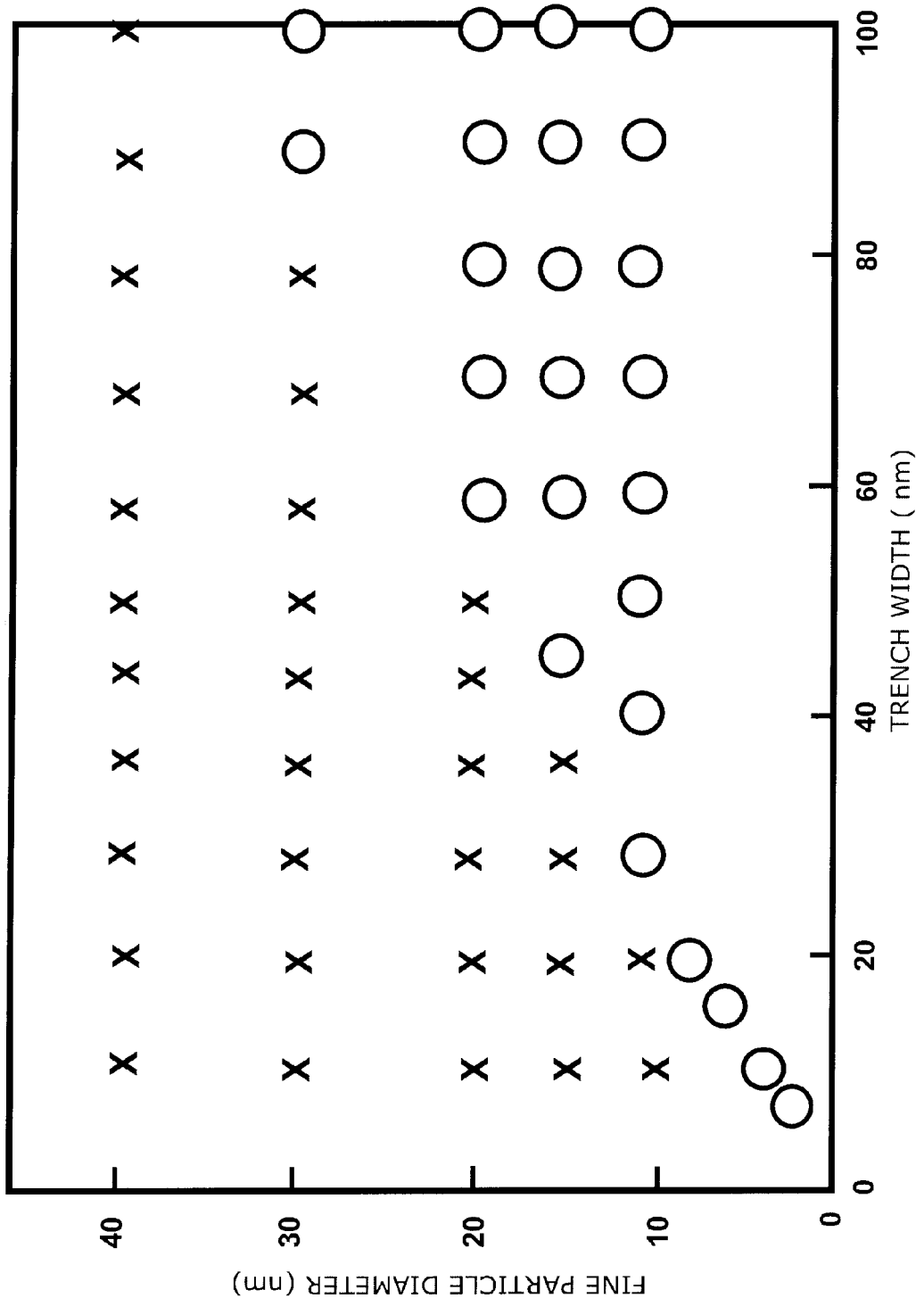
FIG. 2 illustrates embedded states of the Cu thin film under varying diameters of the Cu fine particles and varying line widths of the trench.

FIG. 2 illustrates embedded states of the Cu thin film 9 under varying diameters of the Cu fine particles and varying line widths of the trench 4. A depth of the trench 4 is of a similar order to the width of the trench 4. The "O" marks in FIG. 2 indicate a favorable embedded state and the "X" marks indicate the presence of a space (void) or some other kind of defect.

For trench widths of 7 nm, 10 nm, 20 nm, 30 nm, 60 nm, and 90 nm, maximum fine particle diameters that allow favorable embedding are 2 nm, 3 nm, 8 nm, 10 nm, 20 nm and 30 nm respectively. From these results, it can be understood that when fine particles having a diameter of approximately ⅓ or less than ⅓ of the trench width are used, the thin film can be formed without defects such as voids.

The thin film 9 formed in this way is embedded uniformly along the trench 4. Hence, when, for example, the thin film 9 is Cu interconnection, the interconnection has a uniform resistance and is free from a break. Also, a crystal grain diameter of the Cu thin film 9 embedded in the trench 4 is greater than the interconnection width. Specifically the crystal grain diameter is 100 nm or more for an interconnection width of 30 nm, 50 nm or more for an interconnection width of 20 nm, and 30 nm or more for an interconnection width of 13 nm. Furthermore, the surface of the thin film 9 has a low index surface, i.e. an orientation of the crystal grains at the surface of the thin film being one of (100), (111) and (110).

Figure 3A:
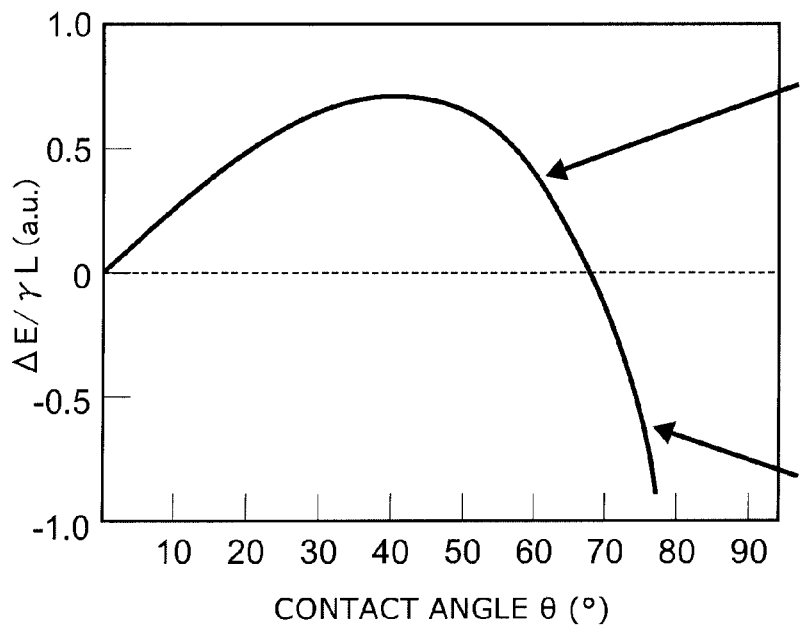
FIGS. 3A to 3C are a graph and schematic diagrams illustrating the functions of the method of manufacturing a thin film according to the first embodiment.
Figure 3C:
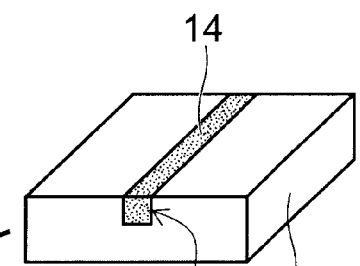
Figure 3B:
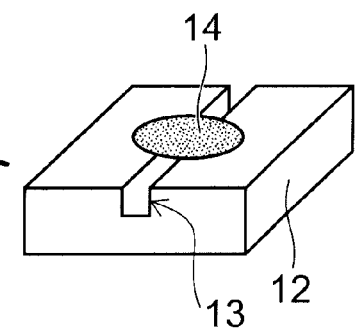

FIGS. 3A to 3C are a graph and schematic diagrams illustrating the functions of the method of manufacturing a thin film according to the first embodiment. FIG. 3A is a graph illustrating a relationship between surface energy of the thin film material 14 when the fine particles contained in the liquid 8 have melted and liquefied, and a contact angle θ of the thin film material 14 with respect to a surface of the insulation film 3 provided on the substrate 2. FIG. 3B is a schematic diagram illustrating a state in which the thin film material 14 is present as a droplet on a surface of an insulation film 12. FIG. 3C, meanwhile, is a schematic diagram illustrating a state in which the thin film material 14 has entered the trench 4 provided on the surface of the insulation film 3.

An energy difference ΔE between a surface energy E1 of the thin film material 14 in a state of being a droplet on the surface of the insulation film 12, as illustrated in FIG. 3B, and a surface energy E2 of the thin film material 14 in a state of having entered the trench 4 provided in the insulation film 3, as illustrated in FIG. 3C, can be expressed using the following formula:

$$\Delta E = E1 - E2 = \gamma L(SL1 - SL2 + (SLS2 - SLS1)\cos\theta) \quad (1)$$

wherein γL is a surface tension of the thin film material 14;

SL1 is a surface area of the thin film material 14 in the state illustrated in FIG. 3B;

SL2 is a surface area of the thin film material 14 in the state illustrated in FIG. 3C;

SLS1 is a contact area between the thin film material 14 and the insulation film 3 in the state illustrated in FIG. 3B; and SLS2 is a contact area between the thin film material 14 and the insulation film 12 in the state illustrated in FIG. 3C.

In FIG. 3A, ΔE/γL is plotted on the vertical axis and the contact angle θ is plotted on the horizontal axis. According to FIG. 3A, when the contact angle θ is less than 67°, ΔE is positive and the surface energy E2 in the state illustrated in FIG. 3C is lower than the surface energy E1 in the state illustrated in FIG. 3B. The liquefied thin film material 14 changes to a form in which the surface energy is reduced. Hence, if the insulation film 3 is selected so as to have a contact angle θ of less than 67° with respect to the thin film material 14, the form of the thin film material 14 will be stabilized by entering the trench 4 in the surface.

Specifically, the thin film material 14, which has been heated by irradiation with microwaves and liquefied, migrates into the trench 4 and is embedded in the trench 4, as illustrated in FIG. 3C. As a result, the exposed surface area is reduced, the surface energy is reduced, and the thin film material is therefore stabilized.

On the other hand, if an insulation film 12 in which the contact angle θ is 67° or more is selected, the surface energy E1 in the state illustrated in FIG. 3B will be lower than the surface energy E2 in the state illustrated in FIG. 3C, and the thin film material 14 will not enter a trench 13 but remain on the surface of the insulation film 12.

Hence, when forming a thin film within a trench on a surface of an insulation film, it is preferable to use an insulation film 3 for which the contact angle θ with respect to the thin film material 14 is less than 67°. Moreover, according to FIG. 3A, when a combination of an insulation film 3 and a thin film material 14 for which the contact angle θ is in the region of 40° is selected, the surface energy difference ΔE is extremely large. Accordingly, the stability of the state of the thin film material 14 that has entered the trench 4 can be enhanced.

Second Embodiment

Figure 4A:
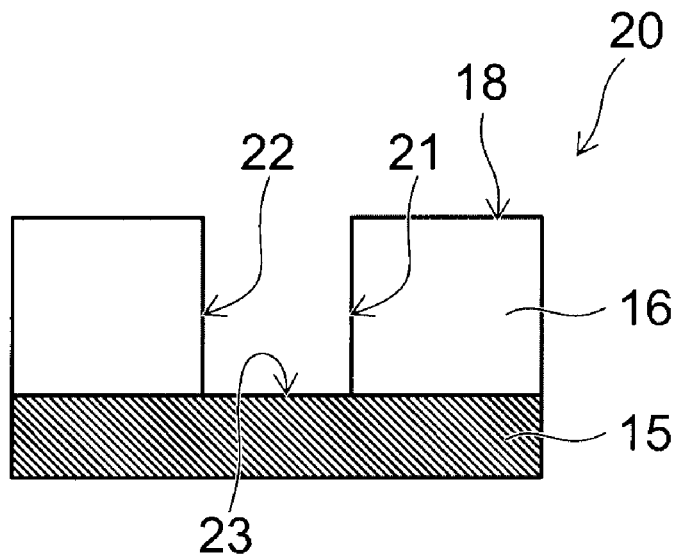
FIGS. 4A to 4C are cross-sectional views schematically illustrating a method of manufacturing a thin film according to a second embodiment.
Figure 4B:
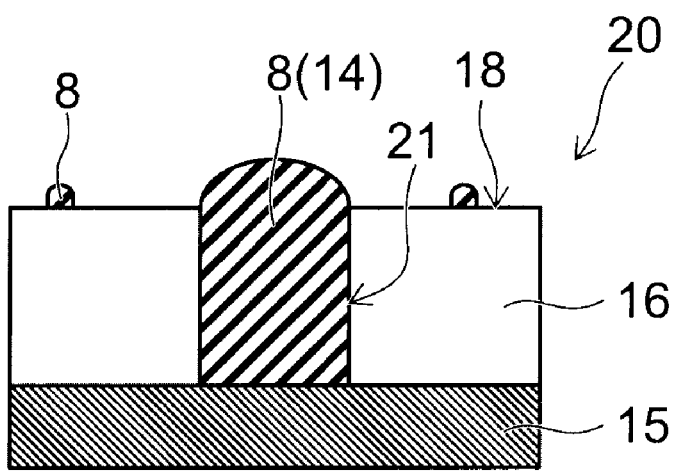
Figure 4C:
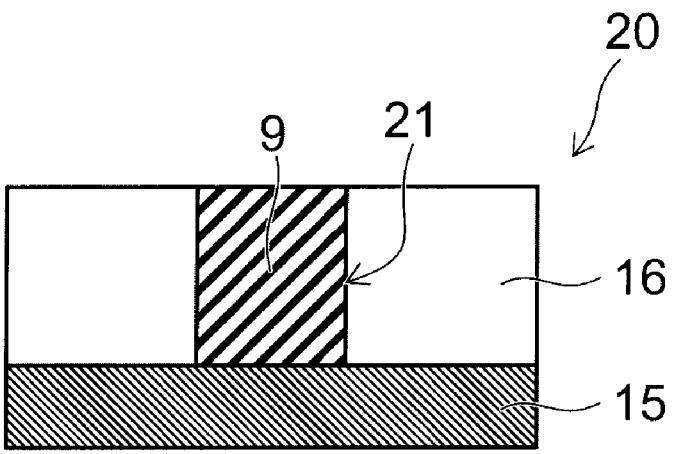

FIGS. 4A to 4C are cross-sectional views schematically illustrating a method of manufacturing a thin film according to a second embodiment. In this embodiment, a trench 21 (or concave portion) is provided on a surface of a processing target member 20 having an insulation film 16 formed on a substrate 15. Also, a bottom surface of the trench 21 is adjusted so as to have a higher affinity for the liquid 8 than a surface 18, which is the surface of the processing target member 20 excluding the trench 21.

As illustrated in FIG. 4A, the insulation film 16 is formed on the substrate 15 that has a surface having a higher affinity for the liquid 8. For the insulation film 16, a material having a lower affinity for the liquid 8 is used. The trench 21 is provided from a surface of the insulation film 16 to the substrate 15. In this way, the affinity of a bottom surface 23 of the trench 21 for the liquid 8 can be made higher than the affinity of the surface 18 of the insulation film 16 for the liquid 8.

For example, when the liquid 8 has water as a solvent in which fine particles are dispersed, a silicon substrate with a film of highly hydrophilic $SiO_2$ formed on the surface thereof can be used as the substrate 15. Also, materials with lower hydrophilicity such as a fluorine-doped silicon oxide (SiOF), a carbon- and fluorine-doped silicon oxide (SiOCF), a nitrogen- and fluorine-doped silicon oxide (SiONF) or the like that contain fluorine (F) can be used as the insulation film 16.

Furthermore, as another aspect, a $SiO_2$ film with a hydrophobic silicon thin film formed on a surface thereof can be used as the insulation film 16. In this case, the surface 18 of the insulation film 16 is hydrophobic, but side surfaces 22 and the bottom surface 23 of the trench 21 are $SiO_2$ surfaces and thus hydrophilic.

Next, the liquid 8 is applied to the surface of the processing target member 20 in which the trench 21 is formed. For instance, screen printing and ink jet methods can be used as an application method. By using such methods, the liquid 8 may be locally applied to the trench 21 and the area therearound.

The surface 18 of the insulation film 16, which is the surface of the processing target member 20 excluding the trench 21, has low affinity for the liquid 8. Therefore, it is difficult for the applied liquid 8 to remain on the surface 18. On the other hand, the bottom surface 23 of the trench 21 has a high affinity for the liquid 8, and so the applied liquid 8 remains within the trench 21. Furthermore, due to surface tension, the liquid 8 that remains in the trench 21 collects the applied liquid 8 around the trench 21, thereby filling the interior of the trench 21 as illustrated in FIG. 4B. However, although the quantity is smaller than in the first embodiment, a certain amount of the liquid 8 may remain on the surface 18 of the insulation film 16.

Next a first heat treatment is performed. For example, the processing target member 20 coated with the liquid 8 is placed in a baking oven maintained at a temperature in a range from 100° C. to 200° C. to volatilize (evaporate) the solvent from the liquid 8 and to form a particulate lump of fine particles. Furthermore, as a second heat treatment, the particulate lumps of the fine particles are converted into a thin film material 14 through heating by irradiation with microwaves in an atmosphere of inert gas or inert gas with an added reductive gas (see FIG. 1B).

Next, after performing the second heat treatment, the surface of the processing target member 20 is polished using a chemical-mechanical polishing (CMP) method to remove the portions of the thin film material 14 that protrude above the top part of the trench 21 and remain on the surface 18. In this way, as illustrated in FIG. 4C, a thin film 9 embedded within the trench 21 can be formed.

In this embodiment, when, for example, a liquid 8 containing fine particles of the semiconductor silicon dispersed therein is used, a particulate lump of the silicon fine particles is formed within the trench 21 as a result of the first heat treatment.

Next, the second heat treatment is performed. Here, the processing target member 20 is, for example, directly heated in a temperature range of from 400° C. to 700° C. in an atmosphere of nitrogen gas that contains hydrogen, and simultaneously irradiated with microwaves in a frequency band from 5.8 GHz to 7 GHz. In this way, as illustrated in FIG. 4C, a polycrystalline silicon thin film 9 can be formed within the trench 21.

Figure 5A:
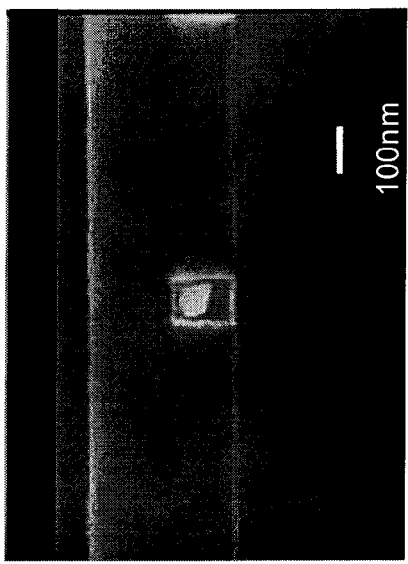
FIGS. 5A to 5C are electron microscope photographs showing cross-sections of Cu thin films embedded in the trench according to a second embodiment.
Figure 5B:
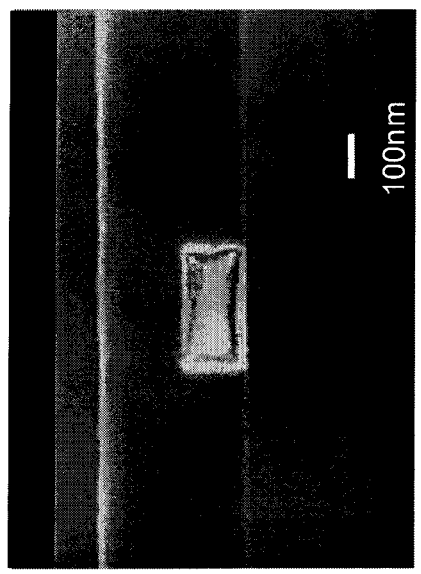
Figure 5C:
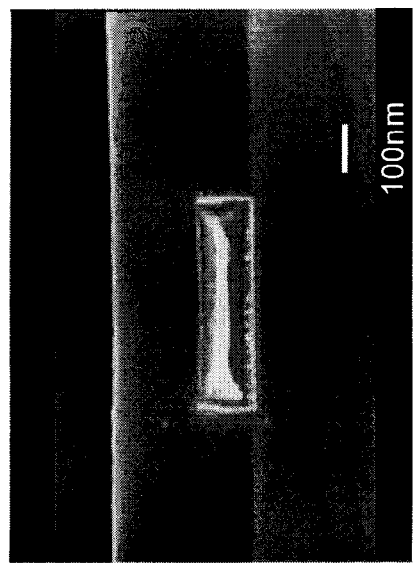

When metal particles of Cu, Ag, Au, Al, or the like are dispersed in the liquid 8, a metal thin film can be formed within the trench 21. FIGS. 5A, 5B and 5C are electron microscope photographs showing cross-sections of Cu thin films embedded in the trench 21 having trench widths of 100 nm, 200 nm and 400 nm respectively. The trenches illustrated in FIGS. 5A, 5B and 5C are filled without spaces (voids).

To provide a structure in which the metal film formed within the trench 21 has a crystal grain size that is greater than the width of the trench and avoid triple point particle boundaries, it is effective to perform the above-described second heat treatment with microwave irradiation in a frequency band of 10 GHz or higher, and preferably a frequency band of 15 GHz or higher and 30 GHz or lower. The reasons for this are as follows. The higher the frequency, the easier it is to heat the metal film by electromagnetic induction, and the more efficient heating can be performed. However, at the same time, if a frequency of approximately 30 GHz or more is used, the microwaves are unable to penetrate into the metal film beyond a surface layer, and heating efficiency is reduced due to the skin effect. These phenomena also apply to the method of manufacturing a thin film according to the first embodiment described above.

Third Embodiment

Figure 6A:
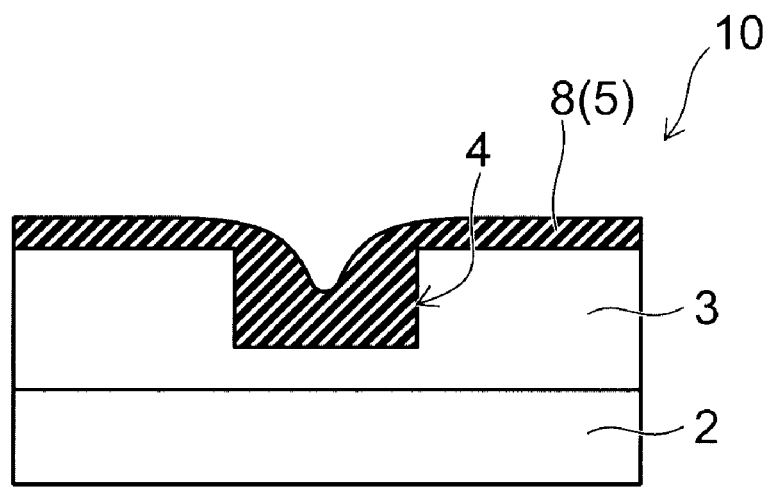
FIGS. 6A to 6C are cross-sectional views schematically illustrating the method of manufacturing a thin film according to a third embodiment.
Figure 6B:
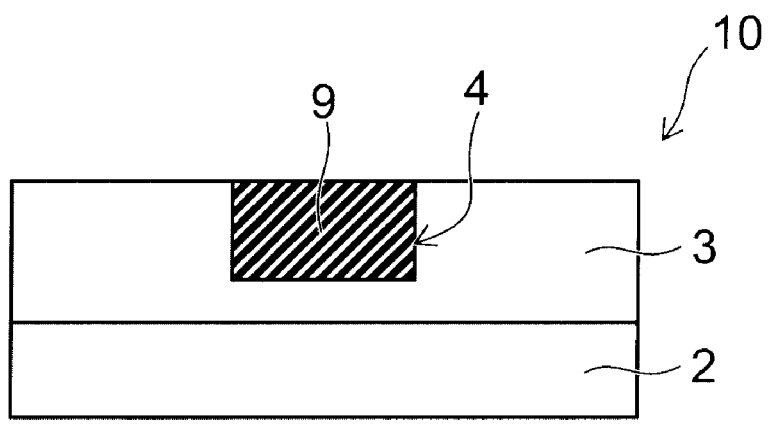

FIGS. 6A to & 6C are cross-sectional views schematically illustrating the method of manufacturing a thin film according to a third embodiment. FIG. 6A is schematic view illustrating a cross-section after a first heat treatment has been performed following the coating of a surface of a processing target member 10 wherein an insulation film 3 is formed on a substrate 2 with a liquid 8 containing fine particles dispersed therein. FIG. 6B is a cross-sectional view illustrating a state in which a thin film 9 is formed in a trench 4 provided on a surface of the insulation film 3.

In this embodiment, for example, a semiconductor substrate is used as the substrate 2. For the fine particles dispersed in the liquid 8, fine particles of silicon (Si) or germanium (Ge), a mixture of fine particles of silicon and germanium, or fine particles of a compound of silicon and germanium (SiGe) can be used.

After coating the surface of the processing target member 10 with the liquid 8 and subsequently performing the first heat treatment to cause the solvent to evaporate from the liquid 8, particulate lumps 5 of the fine particles are formed within the trench 4 provided in the insulation film 3 and on the surface of the insulation film 3, as illustrated in FIG. 6A.

Next, a second heat treatment is performed in which the substrate 2 is irradiated with microwaves and the interior of the trench 4 is filled with fine particles or fine particles dissolved within a thin film material 14. In addition, by polishing the surface of the processing target member 10 using a CMP method and removing the thin film material 14 that remains on the insulation film 3 and the thin film material 14 that protrudes above a top part of the trench 4, a thin film 9 embedded in the trench 4 can be formed, as illustrated in FIG. 6B (see FIG. 1B).

For example, if fine particles of silicon or germanium are dispersed in the liquid 8, the thin film 9 will be a polycrystalline semiconductor thin film of silicon or germanium, respectively. Also, if a mixture of fine particles of silicon and germanium, or fine particles of SiGe is dispersed, a polycrystalline semiconductor thin film of SiGe can be formed.

Figure 6C:
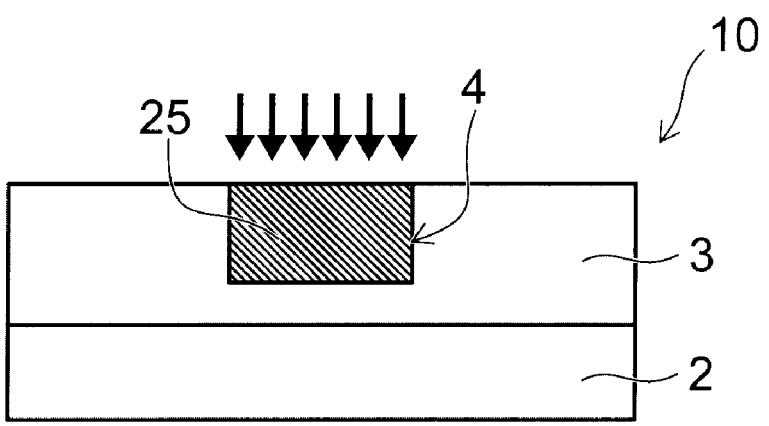

Next, as illustrated in the FIG. 6C, the thin film 9 formed within the trench 4 is annealed by, for example, irradiation with laser light having a wavelength of 1 μm or less. At this time, the laser light is focused on the thin film 9 formed in the trench 4 to heat the thin film 9 to near a melting point, and the thin film 9 is then cooled gradually at a predetermined rate. In this manner, the thin film 9 that is a polycrystalline semiconductor film can be converted to a crystalline film.

A crystal grain size of the crystalline film can be greater than a width of the trench 4. Specifically, the crystal grain size is 200 nm or more for a trench width of 30 nm, 50 nm or more for a trench width of 20 nm, and 40 nm for a trench width of 13 nm. The crystalline orientation of the surface of the thin film 9 can have a low index surface, such as the (100), (111) and (110) faces.

Furthermore, by controlling a depth and the width of the trench 4, the surface of the thin film 9 can be made into a crystalline surface orientated to (100) or (110). Accordingly, a complementary metal-oxide-semiconductor (CMOS) transistor can be provided by forming an n-type metal-oxide-semiconductor (MOS) transistor in a region orientated in the (100) direction and a p-type MOS transistor in a region orientated in the (110) direction.

The invention has been described with reference to a first, second and third embodiment of the invention, but the invention is not limited to these embodiments. For example, design modifications, material modifications, and the like that could be made by a person skilled in the art based on the technological standards at the time of application as well as any other embodiments sharing the technological idea of the invention are included in the technological scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A method for manufacturing a thin film comprising:
applying a liquid to a surface of a processing target member having at least one of a trench and a concave portion, the liquid including a solvent and at least one of fine particles of a metal, fine particles of a semiconductor, fine particles containing a metal oxide, and fine particles containing a semiconductor oxide;
a first heat treatment for volatilizing the solvent of the liquid applied to the surface of the processing target member, and the fine particles being remained on the surface of the processing target member; and
a second heat treatment for heating the fine particles by using microwave irradiation, and at least one of the trench and the concave portion being filled with the thin film containing the fine particles or a component of the fine particles.

2. The method according to claim 1, wherein the fine particles of the metal include at least one element selected from a group of Cu, Ag, Au, and Al.

3. The method according to claim 1, wherein the processing target member includes a semiconductor substrate and an insulating film formed on the semiconductor substrate.

4. The method according to claim 1, wherein the fine particles of a metal contain Cu, and at least one of the trench and the concave portion is filled with the thin film including a Cu crystal grain having a diameter lager than a width of the trench.

5. The method according to claim 1, wherein the fine particles of the semiconductor contain at least one selected from a group of Si, Ge, and SiGe.

6. The method according to claim 1, wherein the first heat treatment is performed in an atmosphere including inert gas or dry air.

7. The method according to claim 1, wherein the second heat treatment is performed in an atmosphere including a reductive gas.

8. The method according to claim 1, wherein a average diameter of the fine particles is less than 1/3 of a minimum width of at least one of the trench and the concave portion.

9. The method according to claim 1, wherein the solvent includes at least one of water and organic solvent.

10. The method according to claim 1, wherein at least one of the trench and the concave portion includes a bottom surface having a higher affinity for the liquid than the surface of the processing target member excluding the groove and the concave portion.

11. The method according to claim 2, wherein the microwave irradiation is performed by using microwaves in a frequency band of 15 GHz or higher and 30 GHz or lower.

12. The method according to claim 3, wherein the processing target member includes an integrated circuit provided on the semiconductor substrate.

13. The method according to claim 3, wherein the insulating film includes a silicon dioxide film ($SiO_2$).

14. The method according to claim 4, wherein a surface of the thin film contains Cu crystal grain surfaces having at least one orientation of <100>, <111> and <110>.

15. The method according to claim 5, wherein a liquid including the fine particles which contain Si is applied on the surface of the processing target member; the processing target member is irradiated with microwaves, while being heated at a range from 400° C. to 700° C.; and at least one of the trench and the concave portion is filled with the thin film including polycrystalline silicon.

16. The method according to claim 5, wherein the thin film is irradiated with a laser light having a wavelength of 1 μm or less.

17. The method according to claim 7, wherein the reductive gas includes hydrogen.

18. The method according to claim 10, wherein the processing target member includes a semiconductor substrate, a silicon dioxide ($SiO_2$) film provided on the semiconductor surface and an insulating film including at least one of a fluorine-doped silicon oxide (SiOF), a carbon- and fluorine-doped silicon oxide (SiOCF), a nitrogen- and fluorine-doped silicon oxide (SiONF), and at least one of the trench and the concave portion is formed from a surface of the insulating film to the $SiO_2$ film so as to include the bottom surface having the $SiO_2$ face.

19. The method according to claim 10, wherein the processing target member includes a semiconductor substrate, a silicon dioxide ($SiO_2$) film provided on the semiconductor surface and a silicon film, and at least one of the trench and the concave portion is formed from a surface of the silicon film to the $SiO_2$ film so as to include the bottom surface having the $SiO_2$ face.

20. The method according to claim 16, wherein a surface of the thin film has at least one crystalline orientation of <100>, <111> and <110>.

* * * * *

UNITED STATES PATENT AND TRADEMARK OFFICE
CERTIFICATE OF CORRECTION

| | |
|---|---|
| PATENT NO. | : 7,972,960 B1 |
| APPLICATION NO. | : 12/886240 |
| DATED | : July 5, 2011 |
| INVENTOR(S) | : Suguro et al. |

It is certified that error appears in the above-identified patent and that said Letters Patent is hereby corrected as shown below:

Claim 4, column 8, line 66, change "lager than" to --larger than--.

Claim 8, column 9, line 10, change "a average" to --an average--.

Signed and Sealed this
Twenty-fifth Day of October, 2011

David J. Kappos
*Director of the United States Patent and Trademark Office*